United States Patent
Christensen et al.

(10) Patent No.: US 11,275,520 B2
(45) Date of Patent: Mar. 15, 2022

(54) MEDIA TYPE SELECTION USING A PROCESSOR IN MEMORY

(71) Applicant: Micron Technology, Inc., Boise, ID (US)

(72) Inventors: Carla L. Christensen, Boise, ID (US); Zahra Hosseinimakarem, Boise, ID (US); Bhumika Chhabra, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 123 days.

(21) Appl. No.: 16/806,436

(22) Filed: Mar. 2, 2020

(65) Prior Publication Data

US 2021/0271406 A1 Sep. 2, 2021

(51) Int. Cl.
| | | |
|---|---|---|
| *G06F 3/06* | (2006.01) | |
| *G06K 9/62* | (2022.01) | |
| *G06F 16/587* | (2019.01) | |
| *G06F 16/535* | (2019.01) | |
| *G11C 11/409* | (2006.01) | |

(52) U.S. Cl.
CPC .......... *G06F 3/0647* (2013.01); *G06F 3/0607* (2013.01); *G06F 3/0685* (2013.01); *G06F 16/535* (2019.01); *G06F 16/587* (2019.01); *G06K 9/6202* (2013.01); *G11C 11/409* (2013.01)

(58) Field of Classification Search
CPC .... G06F 16/00; G06F 16/2228; G06F 16/583; G06F 16/71; G06F 3/005; G06F 3/011; G06F 3/012; G06F 3/04842; G06F 3/04847; G06F 3/0488; G06F 9/50
See application file for complete search history.

(56) References Cited

U.S. PATENT DOCUMENTS 5,361,309 A 11/1994 Sugiyama
5,561,814 A 10/1996 Glew
(Continued)

FOREIGN PATENT DOCUMENTS

JP 08-101802 A 4/1996

OTHER PUBLICATIONS

International Search Report and Written Opinion from related international application No. PCT/US2021/016153, dated May 24, 2021, 11 pages.

*Primary Examiner* — Yong J Choe
(74) *Attorney, Agent, or Firm* — Brooks, Cameron & Huebsch, PLLC

(57) ABSTRACT

Systems, apparatuses, and methods related to image based media type selection are described. Memory systems can include multiple types of memory media. Data can be written in a type of memory media based on one or more settings applied to the data. A setting can be determined based on input received by a logic within the memory system. In an example, a method can include receiving, at logic within a memory system that comprising a plurality of memory media types, data from an image sensor coupled to the logic of the memory system, receiving input from a host, identifying one or more attributes of the data, analyzing the received input to determine an setting, generating the setting based on the analyzed input, and writing the data to a first memory media type of the plurality of memory media types based on the generated setting.

19 Claims, 7 Drawing Sheets

(56) References Cited

U.S. PATENT DOCUMENTS

| | | | |
|---|---|---|---|
| 6,016,548 | A | 1/2000 | Nakamura |
| 6,804,760 | B2 | 10/2004 | Williams |
| 8,427,891 | B2 | 4/2013 | Best |
| 8,886,899 | B1 | 11/2014 | Bao |
| 2003/0059108 | A1* | 3/2003 | Hubel ................. H04N 1/6094 382/165 |
| 2004/0184296 | A1 | 9/2004 | Vyvoda et al. |
| 2016/0018990 | A1 | 1/2016 | Yun |

* cited by examiner

MEDIA TYPE SELECTION USING A PROCESSOR IN MEMORY

TECHNICAL FIELD

The present disclosure relates generally to semiconductor memory and methods, and more particularly, to apparatuses, systems, and methods for media type selection.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining written data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Memory devices can be coupled to a host (e.g., a host computing device) to write data, commands, and/or instructions for use by the host while the computer or electronic system is operating. For example, data, commands, and/or instructions can be transferred between the host and the memory device(s) during operation of a computing or other electronic system.

DETAILED DESCRIPTION

Figure 1:
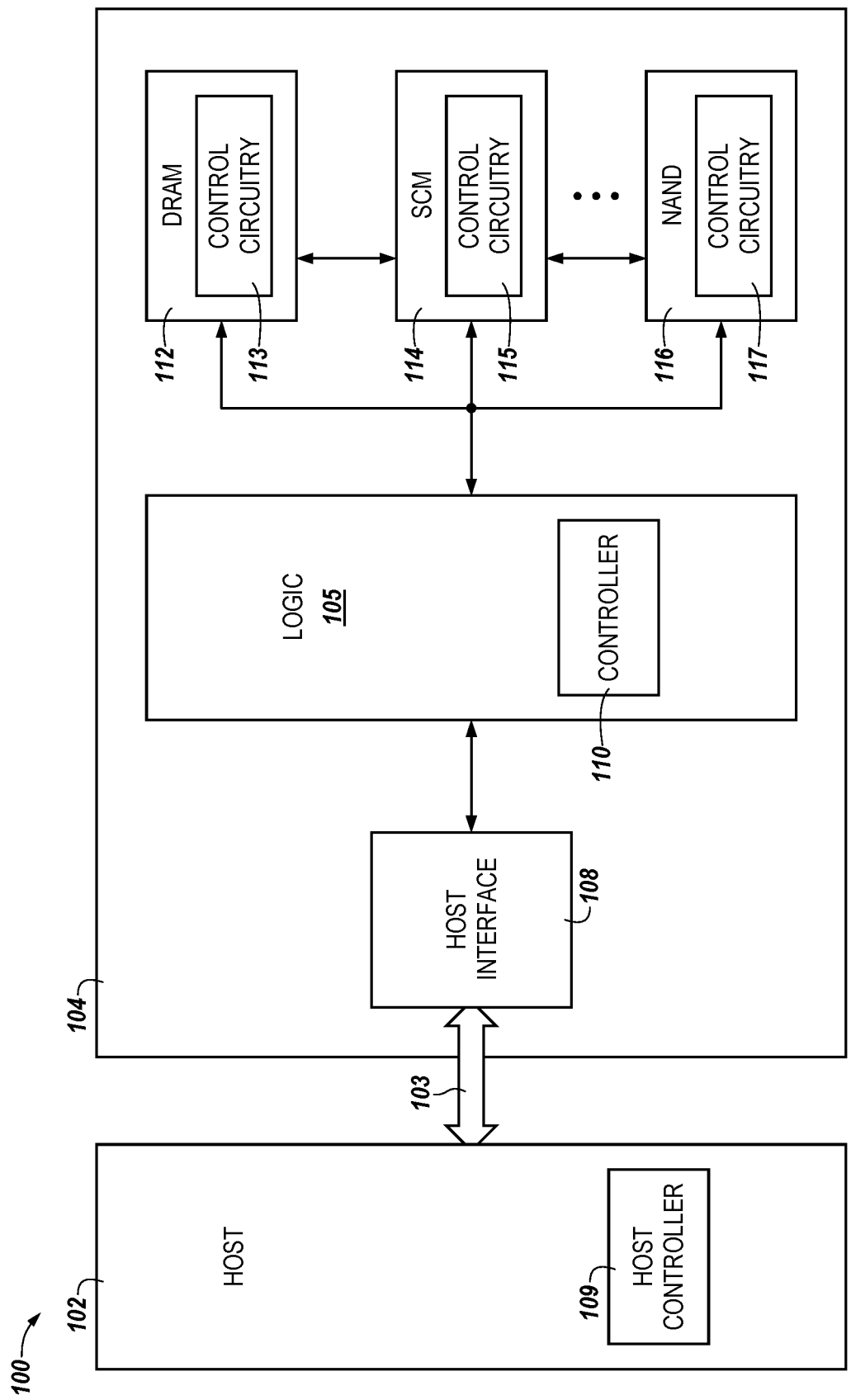
FIG. 1 is a functional block diagram in the form of a computing system including an apparatus including a memory system in accordance with a number of embodiments of the present disclosure.

Systems, apparatuses, and methods related to data based media type selection are described herein. Memory systems can include multiple types of memory media (e.g., volatile and/or non-volatile) and can write data to the various memory media types. The data that can be written to memory media can vary based on attributes such as source, quality of the data, metadata, and/or information included in the data. Data received at the logic of the memory system can be written to a particular type of memory media based on one or more settings applied to the data. In an example, a method can include receiving, at logic within a memory system that comprises a plurality of memory media types, first data from an image sensor coupled to the logic of the memory system, receiving, at the logic of the memory system, input from a host, identifying, at the logic of the memory system, one or more attributes of the first data, analyzing, at the logic of the memory system, the received input to determine a setting, generating, at the logic of the memory system, the setting based on the analyzed input, wherein the setting determines a memory media type of a plurality of memory media type to write the first data to, and writing, at the logic of the memory system, the first data to a first memory media type of the plurality of memory media types based on the generated setting. As used herein, writing data can include storing data to memory media. For example, data can be stored to a memory media by writing the data to a memory media type of a memory system. In addition, the data can also be retrieved by a computing device from its place of storage.

The one or more settings can be determined based on input received at the logic of the memory system. For instance, a particular memory media type can be selected from multiple tiers of memory media types based on characteristics of the memory media type and the settings applied to the data based on received inputs. Characteristics of the memory media type can include volatility, non-volatility, power usage, read/write latency, footprint, resource usage, and/or cost. As used herein, the term "setting" refers to a deterministic guideline to direct data to a particular memory media type. For example, a setting can establish a memory media type to write data to by anticipating more frequent access to the data or having a predetermined or machine learned preference for fast access (e.g., a most responsive memory media type available among a plurality of memory media types).

A computing system including memory systems can include one or more different memory media types which can be used to write data in a computing system. Such data can be transferred between a host associated with the computing system and the logic of the memory system. The data written in memory media can be important or even critical to operation of the computing system and/or the host. There are various types of memory media, and each type of memory media includes characteristics that can be unique to the memory media type. As used herein, types of memory media can include, among others, non-volatile memory and volatile memory.

For example, non-volatile memory can provide persistent data by retaining written data when not powered, and non-volatile memory types can include NAND flash memory, NOR flash memory, read only memory (ROM), Electrically Erasable Programmable ROM (EEPROM), Erasable Programmable ROM (EPROM), and Storage Class Memory (SCM) that can include resistance variable memory, such as phase change random access memory (PCRAM), three-dimensional cross-point memory (e.g., 3D XPoint™), resistive random access memory (RRAM), ferroelectric random access memory (FeRAM), magnetoresistive random access memory (MRAM), and programmable conductive memory, among other types of memory. Volatile memory can require power to maintain its data (e.g., host data, error data, etc.), and volatile memory types can include random-access memory (RAM), dynamic random access memory (DRAM), and static random access memory (SRAM), among others. The characteristics of different memory media types can include features that cause tradeoffs related to performance, storage density, energy requirements read/write speed, cost, etc. In some examples, some memory media types can be faster to read/write as compared to other memory media types but less cost effective than other memory media types. In other examples, memory media types can be faster as compared to other memory media types but consume a large amount of power and reduce the life of a battery, while other memory media types can be slower and consume less power.

As hosts such as mobile devices, semi-autonomous vehicles, fully autonomous vehicles, mobile artificial intelligence systems, etc. become more prevalent, sensors and other devices related to computing systems and hosts are also increasingly prevalent. For example, a host can be a mobile device that includes one or more image sensors (e.g., cameras) to generate data (e.g., photographs, video, etc.). The image sensor(s) can produce frequent and/or large quantities of data which can be used by a computing system, a host, a user interface corresponding to a host, and/or a user to make decisions related to the operation of the host (e.g., a memory media type to write the data). Large quantities of data can be generated and determining a memory media type to write the data can be tedious and error prone.

For example, some data generated and/or received can include attributes, and the attributes can be deemed desirable or undesirable based on a preference of a user and/or a host. As used herein, the term "attribute" refers to aspects of the data. Examples, of an attribute can include a location of the sensor (relative to the host) that generated the data, data with a subject that is out of focus, a facial expression of the subject (e.g., smiling or not smiling), facial features of the subject (e.g., red eyes or no red eyes), subject blur, pixel characteristics, pixel density, subject characteristic (sitting, standing, eyes open, etc.), data with a subject that is out of frame, undesired subjects in the background or foreground, repetitive images of the same subject, repetitive images of the same geographical location, etc. Writing undesired (e.g., repetitive) data from an image sensor to memory media can occupy valuable memory media space, waste power, and/or otherwise waste resources that could otherwise be used by desired data. Balancing the tradeoffs between various different memory media types to write the frequent and/or large quantities of data can be an important endeavor.

In some approaches, data can be written to a memory system based on an order in which the data arrives from an origin or by another predetermined schema and is automatically written to a particular memory media type. This approach can cause the retrieval and interpretation of the data to be slow, ineffective, costly, and/or otherwise waste resources of the computing system (e.g., host). As a result, the tradeoffs, described herein, of a computing system writing data to particular memory media types can become more pronounced. Said differently, writing data according to a predetermined schema can result in non-important data occupying space in a memory media type that is better suited for important (e.g., desired and/or critical) data, and critical data can be confined to a media type that is slower to access. This can lead to inefficient operation of the host and/or error in retrieving critical (e.g., desired) data from memory media in the memory system.

As mentioned, host devices can include communicatively coupled devices (e.g., sensors) which can be intermittently or consistently generating data to be written to memory media type of a memory system. As storage capability of memory systems increases and the volume of generated data increases, the effects of inefficient data storage becomes more tedious and pronounced. These effects can be further exacerbated by the limitations of some approaches to read and interpret data such that the contents can be effective, especially as the amount of data written in memory systems and the speed at which data retrieval is expected.

In contrast, embodiments herein are directed to write data generated from devices communicatively coupled to the logic of the memory system (e.g., sensors generating data) to a memory media type based on settings determined at the logic of the memory system. As used herein, the term "logic" refers to circuitry configured to perform logic operations on data stored in a memory device. The circuitry can comprise a number of sense amplifiers and a number of compute components, which may comprise an accumulator and can be used to perform logical operations (e.g., on data stored in a memory device). In a number of embodiments, the circuitry can be used to perform logic operations using data stored in a memory device as it inputs and stores the results of the logic operations back to the memory device. The circuitry can be located on the memory device so that the logic operations can be performed without transferring data from the memory device.

The logic can select the memory media type based on the setting, attributes of the data, a context of the host device (e.g., a geographical location), or combinations thereof. Writing data to a memory media type based on the settings generated can determine an appropriate memory media type for the data to best utilize resources (e.g., power, space, cost, etc.). User input can be a calibration process where a user establishes preferences for attribute in data. In some embodiments, the user input can be a calibration process where a user establishes a threshold for attribute in data. Data that is above or below the threshold can be written to a particular memory media type and/or discarded. A threshold can be pre-established, or machine learned from input received, and a setting can be established based on the threshold. In some embodiments, rather than being automatically discarded, data can be written to a particular memory media type to be later reviewed for deletion. As more data is generated, the memory system can generate updated settings based on input from the host (e.g., a user). In some embodiments, the updated setting can include new thresholds.

As mentioned, a setting can be generated at the logic of the memory system based on user input and the setting can be applied to the generated additional data. Responsive to the application of the setting, a particular memory media type can be selected and/or the generated additional data can be deleted or written to a selected memory media type to be reviewed for deletion. For example, in a context of mobile devices, decisions related to data received from a sensor can be made quickly and efficiently, and latency in retrieval or storage can be undesirable. In such examples, data that is undesired can be deleted or written in a less accessible memory media (e.g., NAND) and data that is desirable can be written to a memory media that includes quick retrieval features (e.g., DRAM).

The selection of a memory media type from a plurality memory media types, of which to write the data received, can be made at the logic of the memory system, a controller of the logic, and/or a host controller. A logic can be a processor or other circuitry which is implemented internally on a memory (e.g., directly on a same chip as a memory array). The logic of the memory system can include hardware, firmware, and/or software to determine attributes of the incoming data, generate settings, and select a memory media type to write the data. The logic of the memory system may save time and/or power by reducing and/or eliminating external communications. A controller of the logic can be a controller or other circuitry which can be communicatively coupled to the logic to determine attributes of the incoming data and select a memory media type to write the data. A host controller can be a controller or other circuitry which can be communicatively coupled to the logic to determine attributes of the incoming data and select a memory media type to write the data.

Embodiments herein can allow a logic of the memory system including multiple memory media types to selectively determine which memory media type is appropriate for the incoming data, based at least in part, on settings generated at the logic based on inputs, attributes of the data, a context of the host, and/or a combination thereof. As will be described herein, in some embodiments, data previously written to a particular memory media type can be transferred to a different memory media type, based on time, incoming data, a change in an existing setting, additional inputs, the generation of an updated setting, etc.

In the following detailed description of the present disclosure, reference is made to the accompanying drawings that form a part hereof, and in which is shown by way of illustration how one or more embodiments of the disclosure can be practiced. These embodiments are described in sufficient detail to enable those of ordinary skill in the art to practice the embodiments of this disclosure, and it is to be understood that other embodiments can be utilized and that process, electrical, and structural changes can be made without departing from the scope of the present disclosure.

As used herein, designators such as "N," etc., particularly with respect to reference numerals in the drawings, indicate that a number of the particular feature can be included. It is also to be understood that the terminology used herein is for the purpose of describing particular embodiments only and is not intended to be limiting. As used herein, the singular forms "a," "an," and "the" can include both singular and plural referents, unless the context clearly dictates otherwise. In addition, "a number of," "at least one," and "one or more" (e.g., a number of memory devices) can refer to one or more memory devices, whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to." The terms "coupled," and "coupling" mean to be directly or indirectly connected physically or for access to and movement (transmission) of commands and/or data, as appropriate to the context.

The figures herein follow a numbering convention in which the first digit or digits correspond to the figure number and the remaining digits identify an element or component in the figure. Similar elements or components between different figures can be identified by the use of similar digits. For example, 106 can reference element "06" in FIG. 1, and a similar element can be referenced as 206 in FIG. 2. A group or plurality of similar elements or components can generally be referred to herein with a single element number. For example, a plurality of reference elements 330-1, . . . , 330-N (e.g., 330-1 to 330-N) can be referred to generally as 330. As will be appreciated, elements shown in the various embodiments herein can be added, exchanged, and/or eliminated so as to provide a number of additional embodiments of the present disclosure. In addition, the proportion and/or the relative scale of the elements provided in the figures are intended to illustrate certain embodiments of the present disclosure and should not be taken in a limiting sense.

FIG. 1 is a functional block diagram in the form of a computing system 100 including an apparatus including a memory system 104 in accordance with a number of embodiments of the present disclosure. As used herein, an "apparatus" can refer to, but is not limited to, any of a variety of structures or combinations of structures, such as a circuit or circuitry, a die or dice, a module or modules, a device or devices, or a system or systems, for example. The memory system 104 can include a logic 105, host interface 108, a controller 110 (e.g., control circuitry, hardware, firmware, and/or software), and a plurality of memory media devices each including control circuitry.

FIG. 1 illustrates a non-limiting example of multiple memory media types in the form of a DRAM 112 including control circuitry 113, SCM 114 including control circuitry 115, and a NAND 116 including control circuitry 117. While three memory media types (e.g., DRAM 112, SCM 114, and NAND 116) are illustrated, embodiments are not so limited, and there can be more or less than three memory media types. Further, the types of memory media are not limited to the three specifically illustrated (e.g., DRAM 112, SCM 114, and NAND 116) in FIG. 1, other types of volatile and/or non-volatile memory media types are contemplated. In a number of embodiments, the logic 105, the controller 110, the memory media DRAM 112, SCM, 114, and NAND 116, and/or the host interface 108 can be physically located on a single die or within a single package (e.g., a managed memory application). Also, in a number of embodiments, a memory media (e.g., memory media DRAM 112, SCM, 114, and NAND 116) can be included on a single memory system 104.

As illustrated in FIG. 1, the logic 105 can be coupled to the host interface 108 and to the memory media DRAM 112, SCM, 114, and NAND 116 via one or more channels and can be used to transfer data between the memory system 104 and a host 102 having a host controller 109. The host interface 108 can be in the form of a standardized interface. For example, when the memory system 104 is used for data storage in a computing system 100, the host interface 108 can be a serial advanced technology attachment (SATA), peripheral component interconnect express (PCIe), or a universal serial bus (USB), a double data rate (DDR) interface, among other connectors and interfaces. In general, however, host interface 108 can provide an interface for passing control, address, data, and other signals between the memory system 104 and a host 102 having compatible receptors for the host interface 108.

The host 102 can be a host system such as a personal laptop computer, a vehicle, a desktop computer, a digital camera, a mobile telephone, an internet-of-things (IoT) enabled device, or a memory card reader, graphics processing unit (e.g., a video card), among various other types of hosts. The host 102 can include a system motherboard and/or backplane and can include a number of memory access devices (e.g., a number of processing resources, one or more processors, microprocessors, image processor, and/or some other type of controlling circuitry). One of ordinary skill in the art will appreciate that "a processor" can intend one or more processors, such as a parallel processing system, a number of coprocessors, etc. The host 102 can be coupled to a host interface 108 of the memory system 104 by a communication channel 103. Communication channel 103 can be a wired or wireless connection.

As used herein an "IoT enabled device" can refer to devices embedded with electronics, software, sensors, actuators, and/or network connectivity which enable such devices to connect to a network and/or exchange data. Examples of IoT enabled devices include mobile phones, smart phones, tablets, phablets, computing devices, implantable devices, vehicles, home appliances, smart home devices, monitoring devices, wearable devices, devices enabling intelligent shopping systems, among other cyber-physical systems.

In some embodiments, the host 102 can be responsible for executing an operating system for a computing system 100 that includes the memory system 104. Accordingly, in some embodiments, the host 102 can be responsible for controlling operation of the memory system 104. For example, the host 102 can execute instructions (e.g., in the form of an operating system) that manage the hardware of the computing system 100 such as scheduling tasks, executing applications, controlling peripherals, etc.

The computing system 100 can include separate integrated circuits or the host 102, the memory system 104, the host interface 108, the logic 105, the controller 110, and/or the memory media DRAM 112, SCM 114, and/or NAND 116. The computing system 100 can be, for instance, a server system, a high-performance computing (HPC) system, and/or a portion thereof.

Although not illustrated in FIG. 1 as to not obscure the examples of the disclosure, the memory system 104 can be communicatively coupled (e.g., connected) to sensors which can be communicatively coupled to the host 102. The term "communicatively coupled" means directly or indirectly connected and, unless stated otherwise, can include a wired and/or wireless connection. As used herein, the term "sensor" refers to a device that can generate and send data and/or receive data. Some examples of sensors can include temperature devices, imaging devices (e.g., cameras), video devices, audio devices, motion devices, IoT enabled devices (e.g., vehicle electronic control unit (ECU) devices, thermostats, bulbs, locks, security systems, toothbrushes, pet feeders, etc.), external hard drives, among others. The sensors can transmit data for storage in the memory system 104. For example, the logic 105 can be coupled to a plurality of memory media types (e.g., the memory media DRAM 112, SCM, 114, and NAND 116) and receive data from the plurality of sensors.

The logic 105 can receive data multiple times from an individual sensor or from multiple sensors. For example, the host 102 can be a mobile device with one or more cameras (e.g., image sensors), and the one or more cameras can generate one or more photographs and/or videos (e.g., data). The logic 105 can identify one or more attributes of the data. For example, the logic 105 can identify a blur (or lack thereof) of a subject (e.g., can identify if a subject is blurry), a portion of a subject that is out of frame or otherwise visually obstructed from in the data, and/or a facial expression or feature of the subject, etc. The logic can receive input about data from an image sensor and, based on the input, generate a setting to select a memory media type to write the data. That is, the setting can determine a type of memory media to write the data and/or the setting can determine to refrain from writing the data (e.g., the setting can determine to delete the data).

As mentioned, a setting can be determined by input. As used herein, the term "input" refers to information received by the memory system (e.g., logic 105) relating to the data. Input can be received by the logic 105 from a user of the host 102, from the host 102 via a user configurable setting, and/or from a default setting of the host 102. For example, an input can be a user discarding (e.g., deleting) data based on an attribute, a user setting the host 102 to write data to a memory media type or discard data based on one or more attributes, and/or selecting a particular memory media type to write the data. The logic 105 can determine a setting based on a pattern of input and/or a single input received by a user and/or host 102.

In a non-limiting example, a user can provide input that discards data where the subject is blurry (e.g., a blur attribute) and refrains from discarding other data (having a non-blurry attribute) allowing the logic 105 to write the other data to a particular memory media type, by discarding blurry data and not discarding non-blurry data. The logic 105 can generate a setting that includes a subject blur threshold, based on the deletion pattern of a user, and prompt the user (e.g., and/or the host 102) to either accept or reject the setting. If accepted, the logic 105 can apply the subject blur setting to additional data generated by the host 102 where the threshold determines if additional data should be written to a particular type of media or discarded (or saved to a different memory media type for deletion at a later time). Said differently, the logic 105 can generate a setting (e.g., the subject blur setting) based on a pattern of input that can discard data that is above/below a blur threshold. The examples herein can describe prompting a user to accept a setting before applying the setting to additional data. However, it is understood that the logic 105 can apply the generated setting to additional data without acceptance from a user.

In another non-limiting example, a user can provide input that generates a setting to discard data where the subject has red eyes (e.g., a red eye attribute) and refrains from discarding other data (having a non-red eye attribute) allowing the logic 105 to write the other data to a particular memory media type, by setting the host 102 to discard all data where the subject has red eyes. The logic 105 can generate a setting that deletes all data where the subject has red eyes. The logic 105 can apply the red eye setting to additional data generated by the host 102 and determine if the additional data should be written to a particular type of media or discarded (or saved to a different memory media type for deletion at a later time). Said differently, the logic 105 can generate a setting (e.g., the red eye setting) based on a single input set by a user that can discard data or write data to a particular type of media. In addition, the logic 105 can generate a setting that deletes all data where the subject has red eyes based on a threshold (e.g., one subject has red eyes and three subjects have non-red eyes) and prompt the user (e.g., and/or the host 102) to either accept or reject the setting. If accepted, the logic 105 can apply the red eye setting to additional data generated by the host 102.

In yet another non-limiting example, the logic 105 can receive input where a portion of the data (a first photograph) from a particular geographical location (e.g., a geographical attribute) is saved to a first memory media type, and a second portion and third portion of the data (e.g., a second and a third photograph) are saved to a second memory media type. The logic 105 can generate a setting that includes a quantity threshold of data from a particular geographical location and prompt the user (e.g., and/or the host 102) to either accept or reject the setting. If accepted, the logic 105 can apply the quantity threshold setting to additional data generated by the host 102 where the threshold determines if the additional data should be saved to a first memory media type or a second memory media type. Said differently, a user can opt to accept a setting that will refrain from writing data that include the same geographical location (e.g., multiple photographs of a particular landmark or building). The examples herein may describe generating a setting based on a threshold. However, it is understood that the logic 105 can generate a setting without the use of a threshold.

In another non-limiting example, a user and/or the host 102 can provide input to the logic 105 to discard data where the subject is out of frame and/or otherwise obstructed (e.g., an obstruction setting) and write additional data (having non-obstructed subjects) in a particular memory media type. The logic 105 can generate a setting that includes a subject obstructed threshold and prompt the user (e.g., and/or the host 102) to either accept or reject the setting. If accepted, the logic 105 can apply the subject obstruction setting to additional data generated by the host 102 where the threshold is used to determine if additional data (e.g., additionally generated photographs) should be written to a particular type of media or discarded (or saved to a different memory media type).

The logic 105 can be configured to apply one or more settings to incoming data (e.g., one or more incoming photographs). For example, the logic 105 can apply a facial expression setting (e.g., photographs of smiling subjects are desired) and a subject obstruction setting (e.g., a threshold of the subject to be unobstructed) to incoming data (e.g., photographs) generated by a camera (e.g., an image sensor). That is, the one or more settings when applicable, can be applied to the incoming data. The data that includes an unobstructed subject and/or a smiling subject can be written to a first memory media type such as DRAM 112. The data that includes an obstructed subject and/or a subject that is not smiling can be written to a different memory media type such as SCM 114 or NAND 116, or automatically discard. Data as described herein may be data from an image sensor or data from other sources/devices. For example, data can be temperature data from a temperature device, pressure data from a pressure device, etc.

Figure 2:
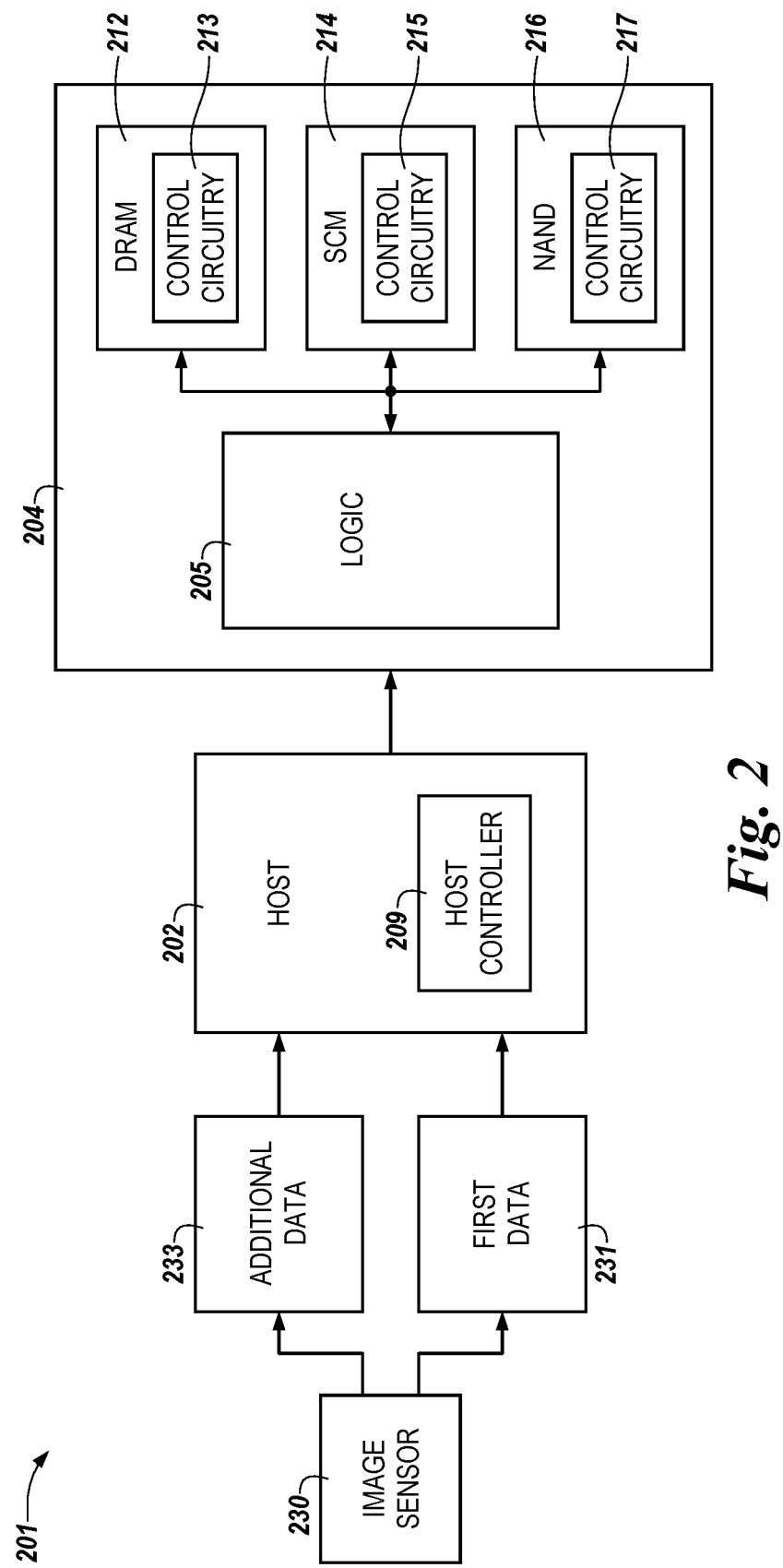
FIG. 2 is a functional block diagram in the form of a computing system including multiple memory media types in accordance with a number of embodiments of the present disclosure.

FIG. 2 is a functional block diagram in the form of a computing system 201 including multiple memory media types in accordance with a number of embodiments of the present disclosure. FIG. 2 illustrates a computing system 201 which includes a host 202, including a host controller 209 which can be analogous to the host 102 and host controller 109 described in connection with FIG. 1. Computing system 201 includes a logic 205 within a memory system which can be analogous to the logic 105 described in connection with FIG. 1. The computing system 201 can include image sensor 230, which can be coupled to the host 202 and produce first data 231.

The host 202 can be communicatively coupled to the sensors 230 via a physical connection (e.g., via wiring, circuitry, etc.) or remotely coupled (e.g., via a wireless signal, near field communication, Bluetooth, Bluetooth Low Energy, RFID, etc.). The host 202 can be communicatively coupled to one or more memory media types via the logic 205. In some embodiments, the host 202 can be communicatively coupled to external hard drives via a physical connection or remotely coupled. FIG. 2 illustrates a non-limiting example of multiple memory media types in the form of a DRAM 212 including control circuitry 213, SCM 214 including control circuitry 215, and a NAND 216 including control circuitry 217. The host 202 can receive the first data 231 generated by the image sensor 230.

The embodiment illustrated in FIG. 2 illustrates an example of the image sensor 230 (e.g., a camera) transmitting first data 231 (e.g., one or more photographs) to the host 202 (e.g., a mobile device) having a host controller 209, where the host controller 209 receives the first data 231 from the image sensor 230. The logic 205 can receive the first data 231 from the host 202 and identify one or more attributes. For example, the logic 205 can identify one or more attributes by analyzing blur of data, determining the pixel characteristics of data, analyzing the pixel density of data, determining the subjects in the data, among others. The host can be a mobile device (e.g., a smart phone) with a display screen that can display the first data 231 to a user. The logic 205 can receive input from a user and/or the host 202 and generate a setting based on the input.

The determined setting can be based on the input from the user and/or host 202 and applied to the data based on the attributes of the data. The data can be a photograph, video, etc. generated by a camera (e.g., image sensor 230). A photograph can include a subject such as a human, animal, nature, etc. The attributes of the data can be related to the quality of the subjects in the data. In some embodiments, the setting can be applied to the data based on the quality of subjects in the data. The quality can be subjective to a user and/or host 202 and can include perceived blur of the subjects, focus of the subjects, unwanted (e.g., unintended) subjects (humans and/or animals) in the image, and/or an open eye status of a human or animal subject, etc. The logic 205 can determine settings based on input from the user and/or host 202 related to the quality of the subject in data generated by the image sensor 230.

The setting can be determined by the logic 205 responsive to input received from a user and/or host 202. In a non-limiting example, a user and/or host 202 can provide input to the logic 205 before data is received. The logic 205 can use the input provided by the user and/or host 202 to determine a setting and apply the setting to the data. In another non-limiting example, the logic 205 can receive first data 231 from an image sensor 230 and additional input about first data 231 and based on the additional input a setting can be determined. Based on the determined setting, the logic 205 can select a memory media type of a plurality of memory media types to write the first data 231.

The computing system 201 can include a mobile device (e.g., the host 202) and a logic 205 coupled to a memory system 204 that includes a plurality of memory media types DRAM 212, SCM 214, and NAND 216. The logic 205 can be configured to receive first data 231 from an image sensor 230. The logic 205 can identify one or more attribute of the first data 231. The attribute can be information about a subject included in the first data 231 and details about the subject (e.g., is the subject blurry, etc.). The logic 205 can receive input from a user and/or the host 202. The input can be received by the logic 205 responsive to a prompt generated by the host controller 209 and/or host 202 to send the input to the logic 205.

The logic 205 can analyze the input received from a user and/or host to determine the user and/or the host 205 preference on data. Based on the analyzed input, the logic 205 can generate a setting to determine which memory media type (e.g., DRAM 212, SCM 214, and NAND 216) to write the first data 231. For example, the input received can be related to an amount of blurriness of the subject the user and/or host 202 prefers in data and a threshold amount of blurriness for received data can be used to generate a setting. The logic 205 can apply the setting (e.g., the subject blurriness setting) to the one or more identified attributes of the first data 231 to select a memory media type (e.g., DRAM 212, SCM 214, and/or NAND 216) to write the first data 231 based on the setting and the one or more identified attributes of the first data 231.

For example, the logic 205 can write, based on the determined setting, the first data 231 to a first memory media type (e.g., DRAM 212) of the plurality of memory media types (e.g., DRAM 212, SCM 214, and NAND 216). The setting (e.g., the subject blurriness setting) can be applied to additional data 233 received by the logic 205 from the image sensor 230.

For example, the logic 205 can receive additional data 233 from the image sensor 230 after receiving first data 231. The logic 205 can write, based on the setting, the additional data 233 to one or more memory media type of the plurality of memory media types (e.g., DRAM 212, SCM 214, and NAND 216). For example, the logic 205 can identify one or more attributes of the additional data 233 and determine a first memory media type (e.g., DRAM 212) of the plurality of memory media types (e.g., DRAM 212, SCM 214, and NAND 216) to write the additional data 233, based on the one or more identified attributes of the additional data 233 and the setting. The logic 205 can receive additional input from a user and/or host 202. In some embodiments, the logic 205 can receive additional input after receiving additional data 233. The logic 205 can analyze the additional input to generate an updated setting based in part on the additional input and the input. The logic 205 can apply the updated setting to the additional data 233 to determine one or more memory media type of the plurality of memory media types (e.g., DRAM 212, SCM 214, and NAND 216) to write the additional data 233.

As more data is generated by the image sensor 230, additional input can be received by the logic 205. The additional input can be related to a user and/or host 202 preferences of data. For example, the logic 205 can be configured to receive additional input and analyze the additional input to generate an updated setting. The additional input can be substantially different than the input and can generate an updated setting that is substantially different from the setting. For example, the additional input can be used to identify changes to the one or more thresholds related to the attributes of data and generate an updated setting to apply to the additional data 233. Said differently, the additional input can be received, by the logic 205, from a user indicating that the threshold of subject blur from the previous setting (generated based on the input) is no longer desirable. In this example, a new threshold of subject blur can be determined for the updated setting and applied to additional data 233. However, this disclosure is not so limited. In some embodiments, the additional input can be substantially similar to the input. For example, the additional input can be received from a user indicating that the threshold of subject blur from the previous setting (generated based on the input) is substantially the same. In this example, the logic 205 can generate an updated setting that is substantially similar to the setting and apply the updated setting to the additional data 233. As used herein, the term substantially intends that the characteristic does not have to be absolute but is close enough so as to achieve the characteristic. For example, "substantially similar" is not limited to absolutely similar. Likewise, "substantially different" is not limited to absolutely different.

The change in threshold and development of an updated setting can alter the storage location of the first data 231. For example, the first data 231 can have been previously written in DRAM 212 and based on the generation of the updated setting from the additional input, the first data 231 can move from DRAM 212 to SCM 214, NAND 216, and/or discarded from the computing system 201.

The additional data 233 generated from the image sensor 230 can include a number of portions. Said differently, the image sensor 230 can be a camera on a mobile device host 202, and the additional data 233 can be a group of data (e.g., a group of photographs) with different attributes. The logic 205 can be configured to apply the updated setting (generated based on the additional input). The logic 205 can transfer the first data 231 from the first memory media type (DRAM 212) to a second memory media type (e.g., SCM) responsive to the updated setting, write a second portion of the additional data 233 to the first memory media type (e.g., DRAM 212) based on the updated setting, discard a first portion of the additional image 233 data based on the updated setting, and write a third portion of the additional data 233 to a third memory media type (e.g., NAND 216) based on the updated setting.

While the disclosure describes receiving data from a sensor, embodiments herein are not so limited. For example, an external hard drive can transmit first data 231 to the host 202 having a host controller 209 through a physical or wireless connection, where the host controller 209 receives the first data 231 from the external hard drive. The logic 205 can receive the first data 231 from the host 202 and write, based on an setting, the first data 231 to one or more memory media type of the plurality of memory media types (e.g., DRAM 212, SCM 214, and NAND 216).

Figure 3:
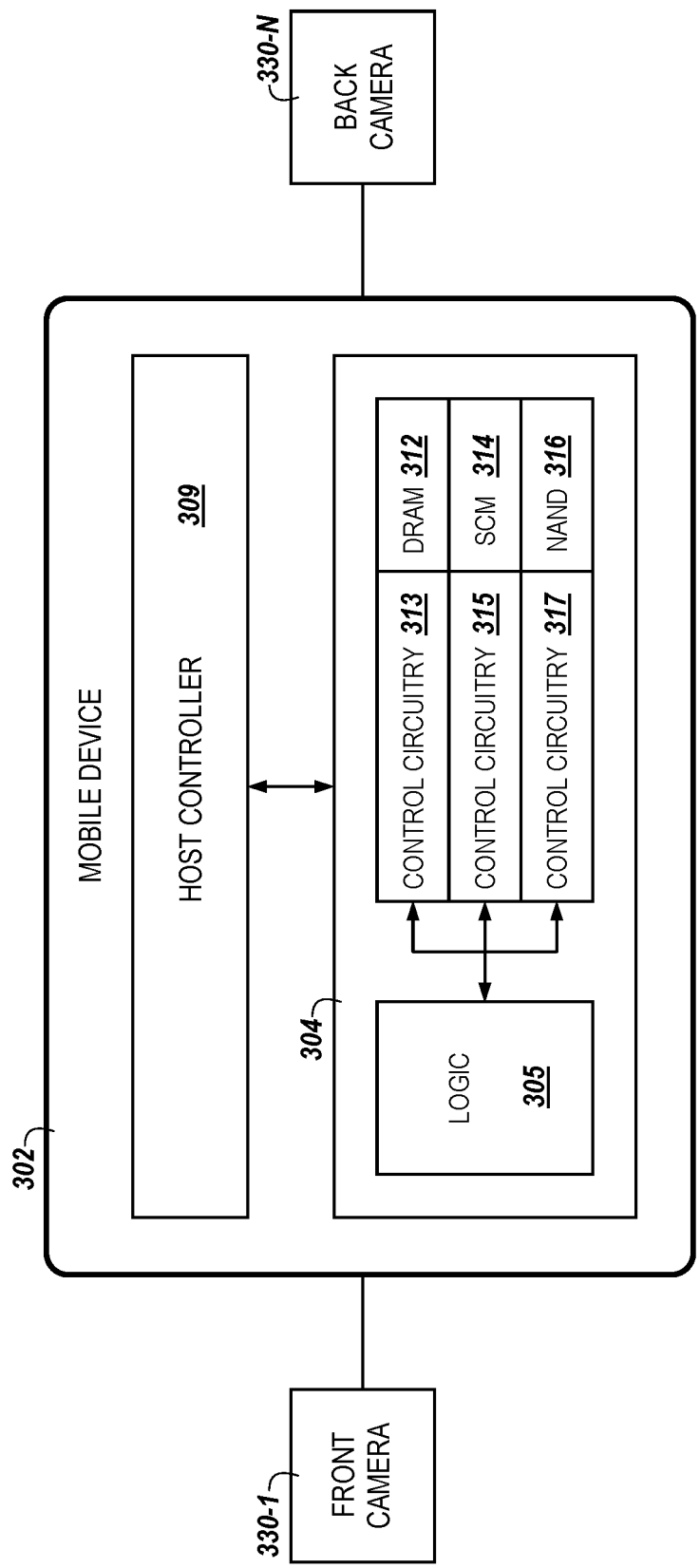
FIG. 3 is a diagram of a memory system including multiple memory media types coupled to a host in the form of a mobile device in accordance with a number of embodiments of the present disclosure.

FIG. 3 is a diagram of a memory system 304 including multiple memory media types coupled to a host 302 in the form of a mobile device in accordance with a number of embodiments of the present disclosure. The host 302 can include a host controller 309 which can be analogous to the host 102 and host controller 109 respectively described in connection with FIG. 1. The host 302 can be communicatively coupled to image sensors in the form of a front camera 330-1 and a back camera 330-N which can be generally referred to as the cameras 330 and be analogous to image sensor 230 described in connection with FIG. 2. The host 302 can include a memory system 304 which can be analogous to memory system 104 described in connection with FIG. 1 and include multiple memory media types. The memory system 304 can include a DRAM 312 including control circuitry 313, a SCM 314 including control circuitry 315, and a NAND 316 including control circuitry 317. Embodiments are not so limited, however, and memory system 304 can include any number or combination of memory media types (e.g., non-volatile and/or volatile). The memory system 304 can include a logic 305 which can be analogous to logic 205 described in connection with FIG. 2.

The example host 302 is in the form of a mobile device (e.g., an IoT enabled device). an IoT enabled device can include mobile phones, smart phones, tablets, phablets, computing devices, implantable devices, vehicles, home appliances, smart home devices, monitoring devices, wearable devices, devices enabling intelligent shopping systems, among other cyber-physical systems. The cameras 330 can include multiple types of cameras (e.g., video or static) located on the mobile device host 302. The location and/or operation of the cameras 330 can be an attribute of the data and be used to generate a setting. For example, data (e.g., photographs) generated by the front camera 330-1 can have similar or different settings than the back camera 330-N.

For example, a user of the mobile device 302 can provide different input about a user preference on photographs generated from the front camera 330-1. A photograph generated from the front camera 330-1 can be a photograph taken by the user of the user (e.g., a selfie). The input about such a photograph from the front camera 330-1 can reflect what a user deems desirable for a selfie style photo. Such input can be focused on attributes such as facial expression, subject cut off (e.g., the head of the user is cut off), eyes open or closed, mouth open or closed, etc. The logic 305 can determine one or more settings based on the input relating to the front camera 330-1. In contrast, photos taken by the back camera 330-N can elicit different input. For example, photographs generated from the back camera 330-N can be of people, nature scenery, animals, other subjects, etc. The input received about photographs taken using the back camera 330-N can be about attributes such as focus, blur of the subject, unwanted or unintentional people or, animals or subjects in the frame, etc. Similarly, the logic 305 can determine one or more settings based on the input relating to the back camera 330-N.

In some embodiments, the multiple settings can be generated and/or applied based on the location of the camera 330 (e.g., image sensor) relative to the host (e.g., mobile device 302). For example, the logic 305 can determine a setting that deletes data from the front camera 330-1 with cut off subject(s) (e.g., a subject's head is cut off by the edge of the photograph) and write data from the front camera 330-1 without cut off subject(s) to a first memory media type (e.g., DRAM 312) of a plurality of memory media types (e.g., DRAM 312, SCM 314, and NAND 316). However, the logic 305 can write data from the back camera 330-N with cut off subject(s) a second memory media type (e.g., SCM 314) of a plurality of memory media types (e.g., DRAM 312, SCM 314, and NAND 316).

The logic 305 can receive data (e.g., photographs) from one or more of the cameras 330 (e.g., image sensors) and identify one or more attributes of the data. In this example, the data is received from the mobile device 302 comprising a camera lens within the cameras 330 and the received data includes a plurality of photographs. The one or more attributes can include a location of the cameras 330 (e.g., image sensor) relative to the host (e.g., mobile device 302). Additionally, or instead of, the identified attributes can be based on one or more similar subjects within the plurality of photographs of the data. The one or more similar subjects can include pixel quality of the plurality of photographs, geographical location of the plurality of photographs, blur of the plurality of photographs, pixel characteristics of the plurality of photographs, pixel density of the plurality of photographs, subjects included in the plurality of photographs, among others, or combinations thereof.

A user of the mobile device 302 can provide input related to data received from the cameras 330. The logic 305 can analyze the input to determine a user and/or host (e.g., mobile device 302) preference. For example, the logic 305 can determine based on the analyzed input, a threshold related to the one or more attributes of the data. A threshold for an attribute of a photograph generating from the front camera 330-1 can be different than a threshold for an attribute of a photograph generated by the back camera 330-N. As such, the logic 305 can determine, based on the analyzed input, a setting including a threshold. The setting can be used to determine a memory media type of the plurality of memory media types (e.g., DRAM 312, SCM 314, and NAND 316) for the data. For example, the setting, based on the analyzed input, can be applied to the identified attributes of the data to determine a memory media type of the plurality of memory media types to write the data. The setting can be different based on the location of the cameras 330 that generated the data. The logic 305 can write the data (e.g., the photographs) to one of the plurality of memory media types.

In some embodiments, each setting can determine one or more memory media types (e.g., DRAM 312, SCM 314, and/or NAND 316) to write the data. For example, a determined setting can write photographs in the data with an identified attribute of a rock (e.g., rock setting) to a first memory media type (e.g., DRAM 312) and write photographs in the data without an identified attribute of a rock to a second memory media type (e.g., SCM 314). Using these methods, each setting can correspond to a plurality of memory media types.

The logic 305 can apply multiple settings to a photograph (and/or video etc.) of the data received from one or more cameras 330 (e.g., image sensors). The logic 305 can determine a memory media type to write data based on the priority of a setting in a plurality of settings. For example, a determined setting can write photographs in the data with an identified attribute of a smiling subject (e.g., smile setting) to a second memory media type (e.g., SCM 314) and write photographs in the data without an identified attribute of a smiling subject to a first memory media type (e.g., DRAM 312). The logic 305 can apply both the smile setting and the rock setting, discussed herein, to identified attributes of the data to determine a memory media type to write the data. The logic 305 can prioritize a first setting (e.g., smile setting) over a second setting (e.g., rock setting) based on analyzed input. For example, the logic 305 can analyze input from a user and/or host (e.g., mobile device 302) and determine that a user and/or host desires data with an identified attribute of a smiling subject in a second memory media type even if other settings apply to the data. Said differently, the logic 305 can prioritize the smile setting (e.g., first setting) over the rock setting (e.g., second setting). For example, if data contain identified attributes of both a rock and a smiling subject, the logic can determine that the data should be written to a second memory media type (e.g., SCM 314) and not a first memory media type (e.g., DRAM 312).

The logic 305 can apply multiple settings to data received from one or more cameras 330 (e.g., image sensors). In a non-limiting example, a first setting can include a first threshold, and responsive to receiving a first photograph from first data the logic 305 can determine if the first photograph is above or below a first threshold corresponding to the first setting. If the first photograph has attributes that are above the first threshold corresponding to the first setting, the logic 305 can write the first photograph to a first memory media type (e.g., DRAM 312). If the first photograph is below the first threshold corresponding to the first setting, the logic 305 can write the first photograph to a second or third memory media type (e.g., SCM 314 or NAND 316).

Continuing with the previous example, a second setting can include a second threshold, and responsive to receiving a second photograph from the first data the logic 305 can determine if attributes of the second photograph is above or below a second threshold corresponding to the second setting. If the second photograph has attributes that are above the threshold corresponding to the second setting the logic 305 can write the second photograph to a second memory media type (e.g., SCM 314). If attributes of the second photograph are below the second threshold corresponding to the second setting the logic 305 can write the second photograph to a third memory media type (e.g., NAND 316).

In other embodiments, the logic 305 can refrain from writing the data (e.g., delete the data) and/or write the data in a particular memory media type (e.g., DRAM 312, SCM 314, and/or NAND 316) to be potentially deleted from the mobile device 302 responsive to review by a user. For example, the logic 305 can apply one or more settings to a plurality of photographs of the data generated from one or more cameras 330. The plurality of photographs of the data can be written as described above to particular memory media types based on the thresholds of the applied settings, and responsive to a determination that the attributes of a portion of the plurality of photographs are not desired (e.g., blurry, unwanted subjects, etc.) the logic 305 can write the data to a particular memory media type (e.g., NAND 316) to be reviewed by a user of the mobile device 302 for deletion and/or refrain from writing the data.

Figure 4:
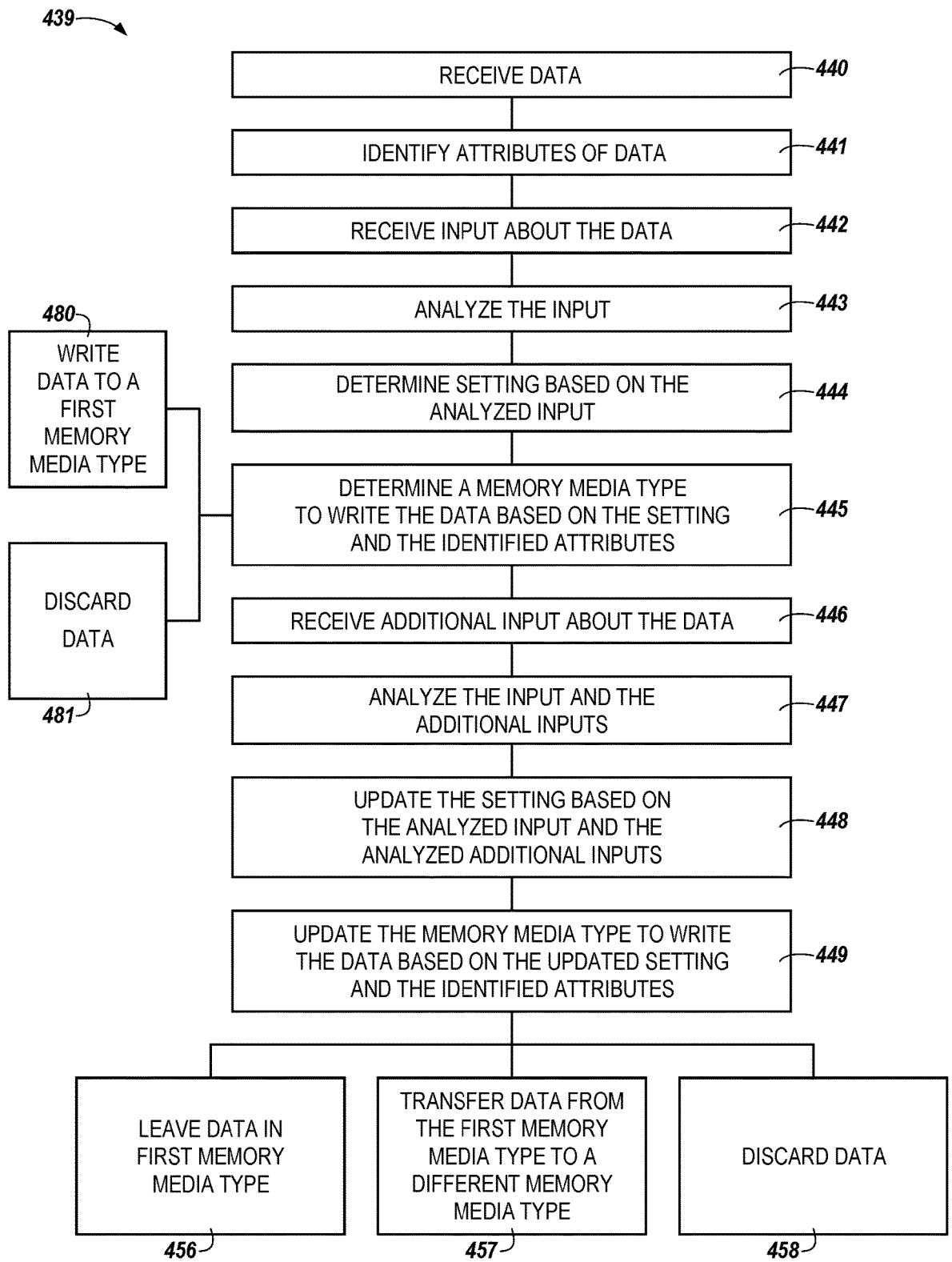
FIG. 4 is a flow diagram representing an example of data based media type selection in accordance with a number of embodiments of the present disclosure.

FIG. 4 is a flow diagram 439 representing an example of data based media type selection in accordance with a number of embodiments of the present disclosure. FIG. 4 describes an example of a generation of a setting based on input from a user and/or a host (e.g., the host 202 of FIG. 2).

In an embodiment described in connection with FIG. 4, a host controller (e.g., the host controller 209) can be coupled to a host device such as a mobile device (e.g., mobile device 302 of FIG. 3). A memory system (e.g., the memory system 104 of FIG. 1) including a plurality of memory media types (e.g., DRAM 112, SCM 114, and NAND 116, of FIG. 1) can include a logic (e.g., the logic 205 of FIG. 2). At 440, the flow diagram 439, includes a logic configured to receive data. The data (e.g., one or more photographs) can be generated from one or more image sensors (e.g., the cameras 330 of FIG. 3) coupled to the host. The data can include one or more one or more attributes.

At 441, the flow diagram 439 describes the logic can identify attributes of the data. For example, the logic can identify attributes such as a level of blur of a subject or a facial expression of a subject. The logic can prompt a user and/or a host for input about the attributes of the data to determine a user preference about the attributes of the data.

At 442, the flow diagram 439 includes describing the logic to receive the input from a user and/or host. A user and/or host can provide input to the logic in a variety of ways. For example, the user can provide information related to user preferences to the host, the host can prompt the user to provide a series of selections relating to the users preferences, the host can receive data and the user can select photographs (and/or video etc.) within the data that meets the preference of the user.

At 443, the flow diagram 439 describes the logic can analyze the input to determine a user preference on writing data to memory media types. For example, the data can be a photograph of a smiling baby. The input can be a user input that photographs of a smiling baby should be written in a particular memory media type. The logic can analyze the input and determine the user prefer photographs of with a smiling baby in particular memory media type. In another example, the user can cause the logic to write five out of eight photographs including a smiling baby to a first memory media type and write the remaining three photographs including a non-smiling baby to a second memory media type and/or discarded the remaining three photographs. The logic can analyze the input provided by the user and determine the user prefers data with a smiling baby in a first memory media type and data with a non-smiling baby in a second memory media type and/or discarded.

At 444, the logic can generate a setting based on the analyzed input. The setting can be related to data preference of a user and can determine the memory media type to write the data. For example, the logic can determine that a user prefers data with a smiling baby in a first memory media type and data with a non-smiling baby in a second memory media type and/or discarded. Based on the analyzed input determining a user preference, the logic can generate an setting that received data with smiling baby should be written to a first memory media type and received data with a non-smiling baby should be written to a second memory media type and/or discarded.

At 445, the flow diagram 439 describes the logic can select a memory media type to write the data based on the setting and the identified attributes. Continuing with the previous example, the logic can determine, based on the identified attributes of the received data, that a first photograph in the received data includes an attribute of a smiling baby and a second photograph in the received data includes a non-smiling baby. The logic can apply the generated setting to the first and second photographs of the received data and select a memory media type to write the first and second photographs. As such, the logic, at block 480, can write the first photograph of the received data to a first memory media type. In addition, at block 481, discard the second photograph of the received data and/or write the second photograph to a second memory media type.

At 446, the flow diagram 439 includes describing the logic to receive the additional input relating to data from a user and/or host. The user and/or host can provide additional input to the logic in substantially the same manner of providing input. At 447, the flow diagram 439 includes describing the logic to analyze the received additional input and the input. Similar to analyzing the input (e.g., at block 443), the logic can analyze the additional inputs to determine a user preference on writing data to memory media types. The logic can analyze the input and the additional input together to determine an updated user preference on writing the data to memory media types.

At 448, the logic can determine an updated setting based on the analyzed input and the analyzed additional input. The updated setting can be related to the updated data preference of the user. At 448, the logic can update the memory media type to write the data based on the updated setting and the identified attributes of the data. For example, if the updated setting is substantially similar to the setting, the logic, at block 456, can leave the first photograph, described at block 445, of the received data in the first memory media type. However, if the updated setting is substantially different to the setting, the logic, at block 457, can transfer the first photograph to a different memory media type or, at block 458, discard the first photograph.

Figure 5:
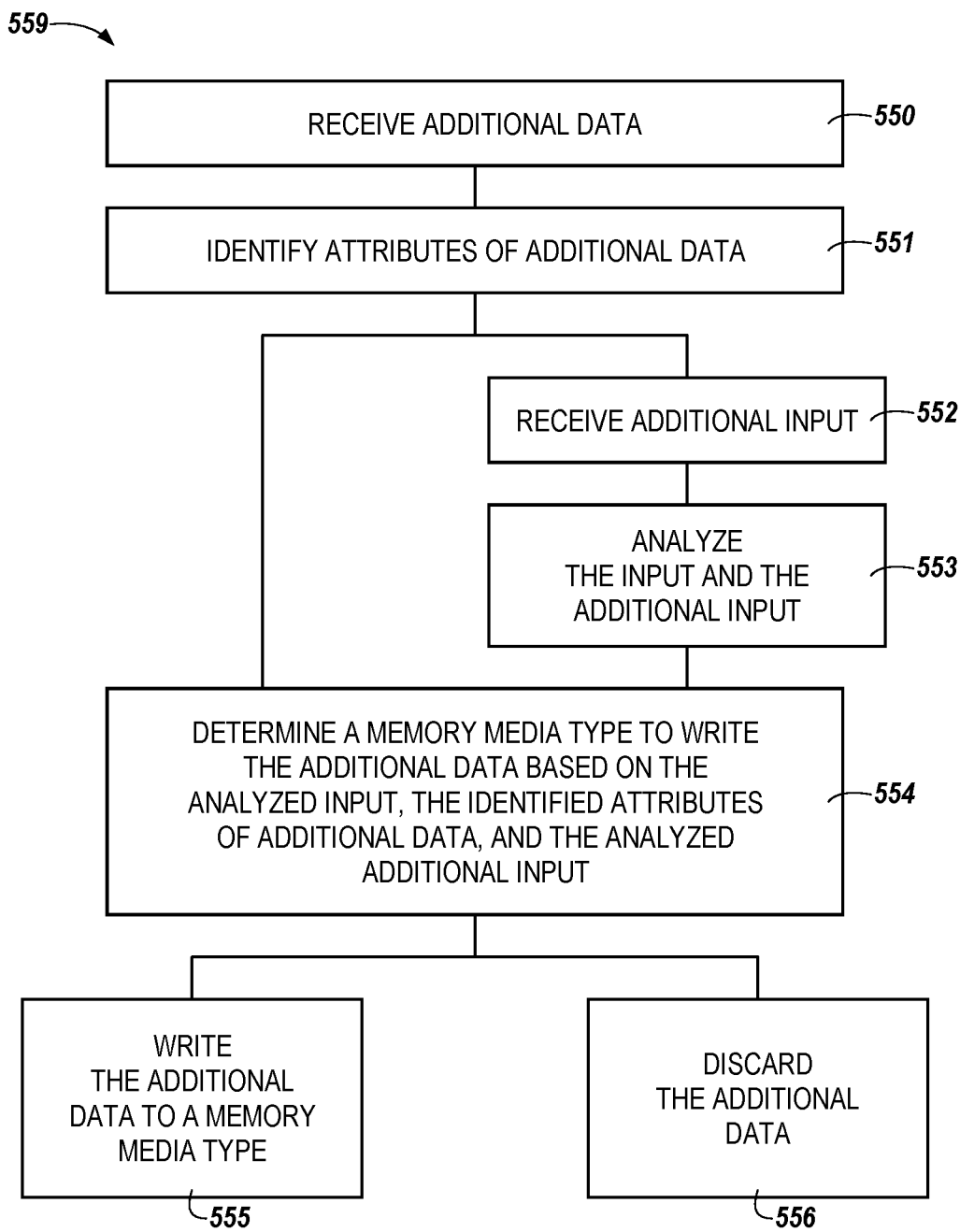
FIG. 5 is another flow diagram representing an example of data based media type selection in accordance with a number of embodiments of the present disclosure.

FIG. 5 is another flow diagram 559 representing an example of data based media type selection in accordance with a number of embodiments of the present disclosure. FIG. 5 describes an example of applying a setting generated based on input from a user and/or a host (e.g., the host 202 of FIG. 2) to additional data (e.g., the additional data 233 of FIG. 2).

As described herein in connection with FIG. 4, a host controller (e.g., the host controller 209 of FIG. 2) can be coupled to a host device such as a mobile device (e.g., mobile device 302 of FIG. 3). A memory system (e.g., the memory system 104 of FIG. 1) including a plurality of memory media types (e.g., DRAM 112, SCM 114, and NAND 116, of FIG. 1) can include a logic (e.g., the logic 205 of FIG. 2). Settings can be generated by the logic to write data in particular memory media types of the plurality of memory media types. A setting generated based on the analyzed input can be applied to additional data. In some embodiments, the additional data can include a number of portions (e.g., a plurality of photographs, plurality of videos, etc.).

At 550, the flow diagram 559 describes the logic can receive additional data. The additional data can include a number of portions. For example, the additional data can be a number of photographs generated by an image sensor in the form of a camera (e.g., the cameras 330 of FIG. 3) coupled to a mobile device. The additional data can be received after the logic receives a first data. The logic can identify the attributes of the additional data, at 551. The attributes of the additional data can vary when more than one image is generated by the cameras. For example, each photograph included in the additional data can have different attributes (e.g., different levels of blur, different levels of facial expressions, different subjects, etc.). As such, a generated setting including a particular threshold for an attribute can affect each portion of the additional data differently.

At 554, the flow diagram 559 describes the logic can determine a memory media type of a plurality of memory media types (e.g., DRAM, SCM, and/or NAND) to write the additional data. The logic can determine the memory media type by applying a setting to the attributes of each portion of the additional data. The logic can determine the setting based on analyzed input and identified attributes of each portion of the additional data. The logic can write, based on the applied setting, one or more portions of the additional data to a memory media type, at block 555, or discard one or more portions of the additional data, at block 556. For example, responsive to applying the setting to the attributes of the one or more portions of additional data, the logic can write one or more portions of the additional data to a first memory media type (e.g., DRAM). Said differently, a portion of the additional data can include subjects that include a facial expression (e.g., a smile) that is at or above a threshold included in a previously established setting, and the portion of photographs of smiling subjects can be written in DRAM. Further, a different portion of the additional data can include subjects that include a facial expression (e.g., devoid of a smile) that is below a threshold included in a previously established setting, and the different portion of photographs of non-smiling subjects can be discarded or written in SCM or NAND for later disposal.

In some embodiments, at 552, the flow diagram 559 describes the logic can receive additional input to determine user preference on data. At 553, the flow diagram 559 describes the logic can analyze the additional input and the input to determine an updated setting. The logic can apply the updated setting to one or more portions of the additional data to determine a memory media type to write the one or more portions of additional data, at 554. For example, the user can review the data that has marked for deletion (e.g., discarded and/or written to in SCM or NAND for later disposal) and provide additional input that can generate an updated setting. For example, when additional data is received and/or when the user is reviewing data written in the memory device, the user can provide additional input that changes a threshold of facial expression (or other attribute) and generate an updated setting to apply to one or more portions of additional data.

Figure 6:
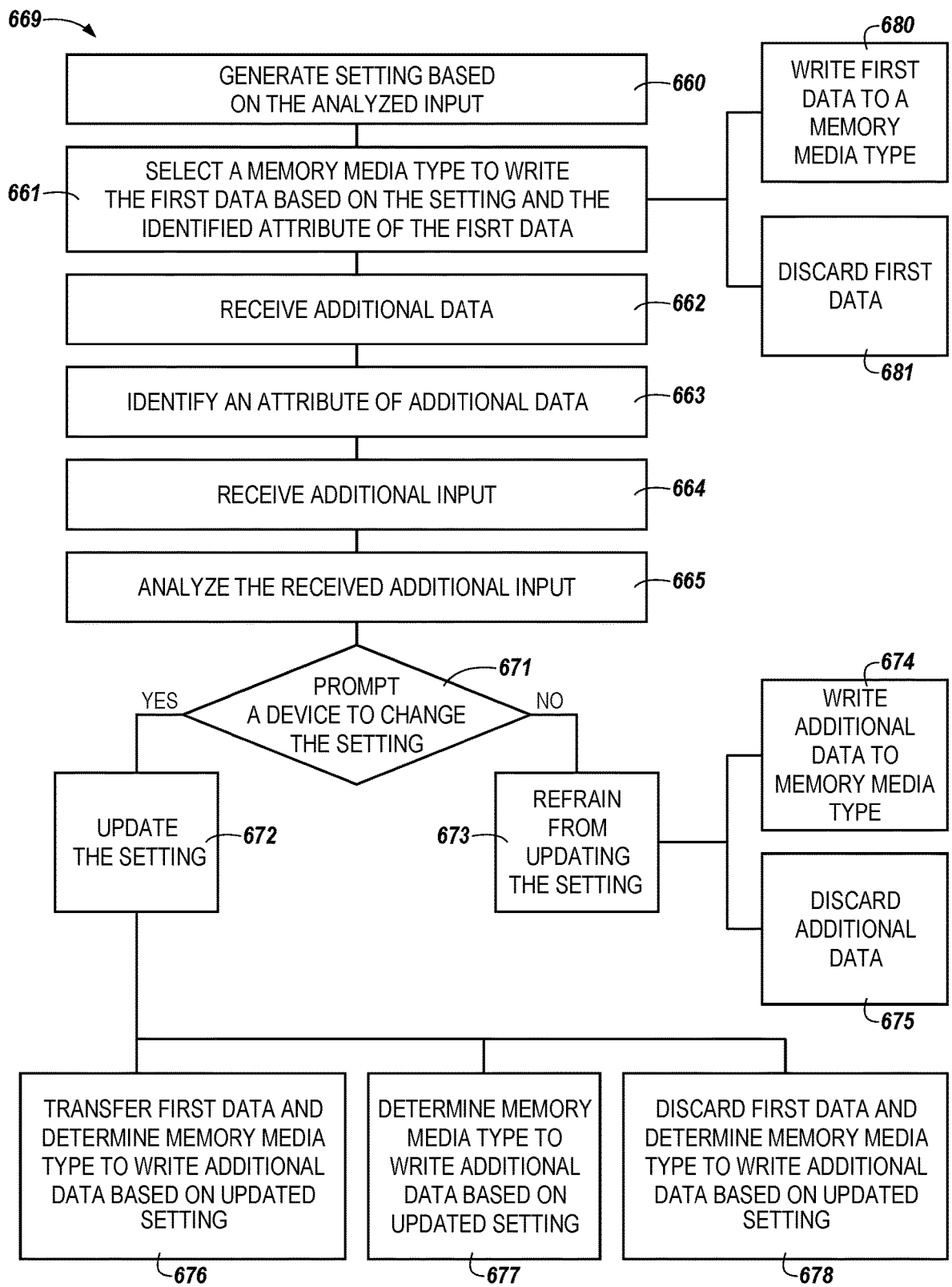
FIG. 6 is another flow diagram representing an example of data based media type selection in accordance with a number of embodiments of the present disclosure.

FIG. 6 is another flow diagram 669 representing an example of data based media type selection in accordance with a number of embodiments of the present disclosure. FIG. 6 describes an example of applying a setting generated based on analyzed input from a user and/or a host (e.g., the host 202 of FIG. 2) to additional data (e.g., the additional data 233 of FIG. 2).

As described herein in connection with FIGS. 4 and 5, a host controller (e.g., the host controller 209) can be coupled to a host device such as a mobile device (e.g., mobile device 302 of FIG. 3). A memory system (e.g., the memory system 104 of FIG. 1) including a plurality of memory media types (e.g., DRAM 112, SCM 114, and NAND 116, of FIG. 1) can include a logic (e.g., the logic 205 of FIG. 2). One or more settings can be generated by the memory system through the logic to write data in a particular memory media type of the plurality of memory media types. A setting generated based on the input can be applied to additional data. In some examples, the logic can receive additional input.

At 660, the logic can generate a setting based analyzed input related to data. The logic can analyze input from a user and/or host to generate a setting for received data. The generated setting can select the memory media type for data that the user would select if prompted. That is, the generated setting is established based on the user preference and is intended to predict the memory media type a user would select for data. For example, the data can be photographs generated by a camera (e.g., the cameras 330 of FIG. 3) where the attributes of each photograph have a level of blur of the subjects. The setting generated can determine based on the level of blur of the subjects a particular memory media type (e.g., DRAM, SCM, and/or NAND) to write the data. The generated setting can be determined based on user preferences by analyzing input from a user and/or host.

At 661, the logic can select a memory media type to write the first data based on the generated setting and identified attributes of the first data. The logic can apply the setting to the first data, by comparing the identified attributes to the generated setting, to select a memory media type for the first data. For example, the generated setting can be to write data including attributes of a smiling baby to a particular memory media type and discard data including attributes of a crying baby. When the logic receives first data including an attribute of a smiling baby, the logic can write the first data to a particular memory media type, at 680. In contrast, when the logic receives first data including an attribute of a crying baby, the logic can discard the first data, at 681. In some embodiments, the logic can discard the first data by writing the first data to a memory media type for later deletion.

The logic, at 662, can receive additional data. The additional data can include one or more portions of data, where the one or more portions of additional data can include different attributes than the first data. That is, the logic can receive a plurality of portions of additional imaged data. The logic, at 663, can identify attributes of the one or more portions of additional data. The one or more positions of additional data can be one or more photographs, videos, etc. The logic can analyze one or more portions of additional data to identify attributes such as, for example, levels of blur, facial expressions, subjects, etc. Each portion of the additional data can include different and/or similar attributes from the other portions of additional data.

The logic, at 664, can received additional input from a user and/or host. The additional input can be related to attributes of data. That is, the logic can receive additional input about attributes of the first data and/or the additional data. For example, the logic can receive data (e.g., first data and/or additional data) from an image sensor and a user and/or host can provide input relating to user preferences about the attributes of the data. That is, the user and/or host can provide input (e.g., input and/or additional input) about identified attributes of imaged data after first data and/or additional data is received. However, this disclosure is not so limited. In some embodiments, as described herein, the user can provide input (e.g., input and/or additional input) before data (e.g., first data and/or additional data) is received.

The logic, at 665, can analyzed the received additional input to determine an update to the setting. At 671, the logic can be prompted to update and/or change the setting based on the received additional input. The logic can compare the additional input to the input to determine the differences. The logic can analyze the differences between the input and the additional input to determine if the setting should be updated. For example, the logic can determine the frequency of each input within a set time span to determine if a user preference has changed. Based on the determination of a changed user preference, the logic can either respond yes to the prompt and, at 672, update the setting or respond no to the prompt and, at 673, refrain from updating the setting.

At 672, the logic determined that the setting should be updated to reflect the updated user preference. The logic can apply the updated setting to the first data previously received and determine a memory media type to write the additional data. For example, at 676, the logic can transfer the first data to a different memory media type and determine if the additional data should be written to a memory media type or discarded based on the updated setting. In another non-limiting example, at 677, the logic refrain from transferring the first data and determine if the additional data should be written to a memory media type or discarded based on the updated setting. In yet another non-limiting example, at 678, the logic can discard the first data and determine if the additional data should be written to a memory media type or discarded based on the updated setting.

At 673, the logic determined that the setting should not be updated due to an unchanged user preference. The logic can apply the setting to the additional data to determine a memory media type for the additional data. Since the setting has not changed the first data is not transferred and/or written to a different memory media type. For example, at 674, the logic can write the additional data to a memory media type of a plurality of memory media types (e.g., DRAM, SCM, and/or NAND). In contrast, at 675, the logic can discard the additional data and/or write the additional data to a memory media type for later deletion.

Figure 7:
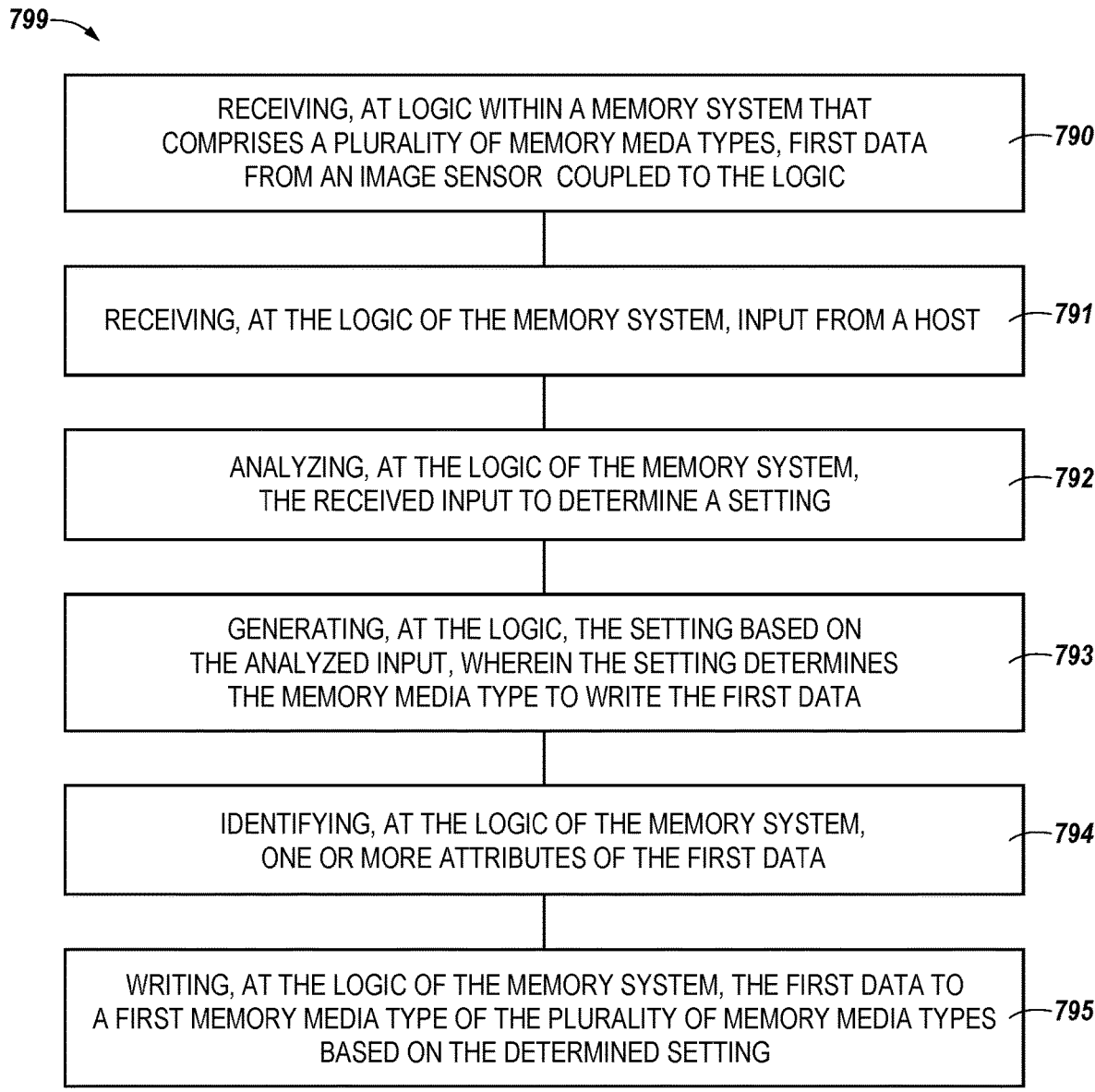
FIG. 7 is a flow diagram representing an example method for data based media type selection in accordance with a number of embodiments of the present disclosure.

FIG. 7 is a flow diagram representing an example method 799 for image based media type selection in accordance with a number of embodiments of the present disclosure. At block 790, the method 799 can include receiving, at the logic of the memory system (e.g., the logic 105 of FIG. 1) coupled to a memory system (e.g., the memory system 104 of FIG. 1) that comprises a plurality of memory media types (e.g., DRAM 112, SCM 114, and NAND 116), first data (e.g., first data 231 of FIG. 2) from an image sensor (e.g., image sensor 230) coupled to the logic. Data can be photographs, videos, etc. generated from an image sensor in the form of a camera (e.g., the cameras 330 of FIG. 3). Each of the photographs can include attributes such as quantity of subjects within the plurality of photographs, pixel quality of the photographs, and a geographical location of the plurality of photographs, a quality of the subject in the photographs, facial expression, focus of a subject, etc.

At block 791, the method 799 can include the logic receiving input from a user and/or host related to a user preference. The input from the user and/or host can be used by the logic to generate a setting. The setting can be used to determine a memory media type of the plurality of memory media types to write the first data. For example, at block 792, the method 799 can include the logic analyzing the input to determine a setting based on a user preference. For example, the logic can review user input to predict which memory media type a user would write the first data to and determine a setting based on that prediction. At block 793, the method 799 can include the logic generating a setting based on the analyzed input. The setting can determine a memory media type to write the first data by applying the setting to the first data.

At block 794, the method 799 can include the logic identifying one or more attributes of the first data. The attributes of the first data can be used by the logic to select a memory media type to write the first data. For example, the logic can apply the setting to the first data by applying the setting to the attributes of the first data. Based on the attributes of the first data and the applied setting a memory media type can be selected. The setting generated from the data can include a threshold of the attribute and based on the threshold, the first data can be written to a memory media type.

At block 795, the method 799 can include the logic writing, based at least in part on the applied setting, the first data to a first memory media type (e.g., DRAM) of the plurality of memory media types. The applied setting can in some embodiments change based on additional input. The additional input can be related additional data (e.g., the additional data 233)

For example, the method 799 can include the logic receiving additional data from the image sensor coupled to the logic and identifying attributes of the additional data. The attributes of the additional data can be different than the attributes of the first data. In some embodiments, the attributes of the additional data can elicit additional input from a user and/or a host.

For example, the method 799 can include the logic receiving additional input about the attributes of the additional data and applying an updated setting to the additional data. In another example, the logic can receive additional data and apply the setting to the additional data when additional input is not received. In some embodiments, the logic can receive additional input before receiving additional data.

The method 799 can include the logic transferring the first data from the first memory media type (DRAM) to a second memory media type (e.g., SCM or NAND) based on the updated setting. Further, as described herein, the additional data can include one or more portions that can be written in memory media differently based on the updated setting. For example, the method 790 can include discarding a first portion of the additional data received, based at least in part on the updated setting and writing a second portion of the additional data received to a second memory media type (e.g., SCM or NAND) of the plurality of memory media types.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
receiving, at logic within a memory system that comprises a plurality of memory media types, data from an image sensor coupled to the logic of the memory system;
receiving, at the logic of the memory system, an input from a host;
identifying, at the logic of the memory system, one or more attributes of the data from the image sensor;
analyzing, at the logic of the memory system, the received input to determine a setting;
generating, at the logic of the memory system, the setting based on the analyzed input, wherein the setting determines a memory media type of the plurality of memory media types to write the data; and
writing, the data to a first memory media type of the plurality of memory media types based at least in part on the one or more attributes of the data from the image sensor and the input from the host.

2. The method of claim 1, further comprising:
receiving, at the logic of the memory system, additional data from the image sensor coupled to the logic of the memory system; and
writing the additional data to a second media type of the plurality of media types or discarding the additional data based at least in part on one or more attributes of the additional data from the image sensor, wherein the second media type is different from the first media type.

3. The method of claim 1, wherein identifying one or more attributes comprises at least one of:
analyzing a blur of the data from the image sensor;
determining pixel characteristics of the data from the image sensor;
analyzing a pixel density of the data from the image sensor; or
determining a subject in the data from the image sensor; or
any combination thereof.

4. The method of claim 1, further comprising:
receiving, at the logic of the memory system, a plurality of portions of additional data from the image sensor;
identifying, at the logic of the memory system, attributes of the plurality of portions of additional data; and
updating, at the logic of the memory system, setting for determining which media type of the plurality of media types is associated with the one or more attributes based on additional input from the host.

5. The method of claim 4, further comprising discarding the data from the sensor previously written to the first memory media type based on the updated setting.

6. The method of claim 5, further comprising:
transferring the data from the first memory media type to a second memory media type based on the updated setting;
discarding a first portion of the plurality of portions of additional data based at least in part on the updated setting; and
writing a second portion of the plurality of portions of additional data to the first memory media type.

7. An apparatus comprising:
a memory system comprising a plurality of memory media types; and
a logic within the memory system, wherein the logic of the memory system is configured to:
receive data from an image sensor, wherein the image sensor is coupled to the logic of the memory system;
identify one or more attributes of the data;
analyze input received from a host;
generate a setting based on the analyzed input, wherein the setting determines a memory media type of the plurality of memory media types to write the data; and
write, based on the setting and the identified one or more attributes, the data to a first memory media type of the plurality of memory media types.

8. The apparatus of claim 7, wherein the logic of the memory system is further configured to:
receive additional data from the image sensor; and
write, based at least in part on the setting, the additional data to one or more memory media types of the plurality of memory media types.

9. The apparatus of claim 7, wherein the logic of the memory system is further configured to:
receive additional input from a host coupled to the logic of the memory system; and
update the setting based in part on the additional input and the input.

10. The apparatus of claim 9, wherein the additional input and the input are substantially different, and the updated setting and the setting are substantially different.

11. The apparatus of claim 9, wherein the additional input and the input are substantially similar, and the updated setting and the setting are substantially similar.

12. The apparatus of claim 7, wherein the plurality of memory media types includes non-volatile memory and volatile memory.

13. A system comprising:
a memory system comprising a plurality of memory media types;
an image sensor coupled to the memory system; and
a logic within the memory system, wherein the logic of the memory system is configured to:
receive data from an image sensor;
identify attributes of the data;
analyze an input received from a host;
generate a setting based on the analyzed input, wherein the setting determines a memory media type of the plurality of memory media types to write the data;
apply the generated setting to the identified attributes of the data; and
determine, based on the applied setting, the memory media type of the plurality of memory media types to write the data.

14. The system of claim 13, wherein the logic of the memory system is further configured to write, based on the determined memory media type, the data to a first memory media type of the plurality of memory media types.

15. The system of claim 13, wherein the logic of the memory system is further configured to discard the data based on the determined memory media type.

16. The system of claim 13, wherein:
the data is received from a mobile device comprising a camera lens and the received data includes a plurality of photographs; and
the identified attributes are based on one or more similar subjects within the plurality of photographs, wherein the subjects include at least one of pixel quality of the plurality of photographs, geographical location of the plurality of photographs, blur of the plurality of photographs, pixel characteristics of the plurality of photographs, pixel density of the plurality of photographs, or subjects included in the plurality of photographs.

17. The system of claim 13, wherein the plurality of memory media types includes at least one of dynamic random-access memory (DRAM), storage class memory (SCM), or NAND.

18. The system of claim 13, wherein the logic of the memory system is further configured to:
identify attributes of additional data;
analyze the identify attributes of the additional data;
received additional input from the host;
transmit a prompt to the host coupled to the logic of the memory system, wherein the prompt is a confirmation of a change to the setting; and
update the setting based on a received response to the prompt.

19. The system of claim 13, wherein the logic of the memory system is further configured to:
identify attributes of additional data;
analyze the identify attributes of the additional data;
received additional input from the host;
transmit a prompt to the host coupled to the logic of the memory system, wherein the prompt is a confirmation of a change to the setting; and
refrain from updating the setting based on a received response to the prompt.

\* \* \* \* \*